US011460725B2

(12) United States Patent
Choi et al.

(10) Patent No.: US 11,460,725 B2
(45) Date of Patent: Oct. 4, 2022

(54) INSPECTION APPARATUS AND METHOD OF DRIVING THE SAME

(71) Applicant: SAMSUNG DISPLAY CO., LTD., Yongin-si (KR)

(72) Inventors: Kyu Wook Choi, Asan-si (KR); Kwang-su Lee, Asan-si (KR); Choonggil Lim, Cheonan-si (KR); Haesung Kim, Hwaseong-si (KR); Jun Ho Jang, Cheonan-si (KR); Sangkeun Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 484 days.

(21) Appl. No.: 16/701,770

(22) Filed: Dec. 3, 2019

(65) Prior Publication Data

US 2020/0174291 A1    Jun. 4, 2020

(30) Foreign Application Priority Data

Dec. 4, 2018  (KR) .......................... 10-2018-0154079

(51) Int. Cl.
| | |
|---|---|
| *G02F 1/13* | (2006.01) |
| *G09G 3/00* | (2006.01) |
| *H01L 51/00* | (2006.01) |
| *G01M 5/00* | (2006.01) |
| *G06F 3/00* | (2006.01) |

(Continued)

(52) U.S. Cl.
CPC .......... *G02F 1/1309* (2013.01); *G01M 5/005* (2013.01); *G01M 5/0033* (2013.01); *G06F 1/1652* (2013.01); *G06F 3/005* (2013.01); *G06F 3/16* (2013.01); *G09G 3/006* (2013.01); *H01L 51/0031* (2013.01); *H04R 1/08* (2013.01)

(58) Field of Classification Search
CPC ... G01M 5/0033; G01M 5/005; G06F 1/1652; G06F 3/16; G06F 3/005; H01L 51/0031; G02F 1/1309; G02F 1/1303; G09G 3/006; H04R 1/08
See application file for complete search history.

(56) References Cited

U.S. PATENT DOCUMENTS 7,859,274 B2 * 12/2010 Kim ...................... G02F 1/1309
324/754.21
9,710,105 B2 * 7/2017 Uzelac ............... G01R 31/2829
(Continued)

FOREIGN PATENT DOCUMENTS

| CN | 103136490 A | * | 6/2013 | ............. G09G 3/006 |
| EP | 2597635 A1 | * | 5/2013 | ............. G09G 3/006 |

(Continued)

*Primary Examiner* — Vinh T Lam
(74) *Attorney, Agent, or Firm* — F. Chau & Associates, LLC

(57) ABSTRACT

An inspection apparatus includes: a plurality of support members that support a display panel at a predetermined height; a bending-pressing member that presses a pressing surface of the display panel; a sound wave sensor that senses a sound wave generated from the display panel during a bending inspection process, wherein during the bending inspection process, the bending-pressing member presses the pressing surface of the display panel; and an inspection controller that detects a crack in the display panel using the sound wave sensed by the sound wave sensor.

20 Claims, 6 Drawing Sheets

(51) Int. Cl.
  *G06F 1/16*  (2006.01)
  *G06F 3/16*  (2006.01)
  *H04R 1/08*  (2006.01)

(56) References Cited

U.S. PATENT DOCUMENTS

| | | | |
|---|---|---|---|
| 10,037,722 B2 * | 7/2018 | Trock | G09G 3/006 |
| 10,417,946 B2 * | 9/2019 | Trock | G09G 3/006 |
| 2013/0187898 A1 * | 7/2013 | Lee | G09G 3/006 |
| | | | 345/204 |
| 2014/0049463 A1 * | 2/2014 | Seo | G06F 1/1694 |
| | | | 345/156 |
| 2018/0074675 A1 * | 3/2018 | Soh | G06F 3/043 |

FOREIGN PATENT DOCUMENTS

| | | | | |
|---|---|---|---|---|
| EP | 2993870 A1 * | 3/2016 | | G02F 1/133305 |
| EP | 3588975 A1 * | 1/2020 | | G02F 1/133308 |
| JP | 2018032409 A * | 3/2018 | | G06F 1/1626 |
| KR | 10-2006-0044032 | 5/2006 | | |
| KR | 10-2016-0033832 | 3/2016 | | |
| KR | 10-2016-0087470 | 7/2016 | | |
| KR | 10-1830679 | 2/2018 | | |
| WO | WO-2013143704 A2 * | 10/2013 | | G01M 5/0033 |

* cited by examiner

INSPECTION APPARATUS AND METHOD OF DRIVING THE SAME

CROSS-REFERENCE TO RELATED APPLICATION

This application claims priority under 35 U.S.C. § 119 to Korean Patent Application No. 10-2018-0154079, filed on Dec. 4, 2018, the disclosure of which is incorporated by reference herein in its entirety.

TECHNICAL FIELD

The present inventive concept relates to an inspection apparatus, and more particularly, to an inspection apparatus for automated inspection of bending defects of a display panel and a method of driving the inspection apparatus.

DISCUSSION OF THE RELATED ART

A display device may be either a liquid crystal display (LCD) device or an organic light emitting display (OLED) device.

A liquid crystal display device includes a liquid crystal display panel displaying an image using light transmittance of a liquid crystal, and a backlight assembly located under the liquid crystal display panel and providing light to the liquid crystal display panel.

An organic light emitting display device displays an image using an organic light emitting diode that emits light by recombination of electrons and holes in an emission layer of the OLED device. Organic light emitting display devices have a relatively fast response speed and have lower power consumption compared to LCD devices.

To provide a wide viewing angle of the display device, a curved display device in which edges of the screen is curved toward the viewer has been under development. A curved display device may provide a wide viewing angle of an image displayed by the display device, and the displayed image may be seen with a feel of enhanced depth. The curved display device is currently being developed with various sizes, curvatures and resolutions suitable for various electronic devices, such as a television (TV), a monitor, a smart phone and a wearable.

SUMMARY

According to an exemplary embodiment of the present inventive concept, an inspection apparatus includes: a plurality of support members that support a display panel at a predetermined height; a bending-pressing member that presses a pressing surface of the display panel; a sound wave sensor that senses a sound wave generated from the display panel during a bending inspection process, wherein during the bending inspection process, the bending-pressing member presses the pressing surface of the display panel; and an inspection controller that detects a crack in the display panel using the sound wave sensed by the sound wave sensor.

In an exemplary embodiment of the present inventive concept, the inspection apparatus further includes: a plurality of cameras that capture an image of the display panel corresponding to the pressing surface of the display panel before and after the bending inspection process. The inspection controller detects the crack of the display panel using the image of the pressing surface before the bending inspection process and the image of the pressing surface after the bending inspection process.

In an exemplary embodiment of the present inventive concept, each of the plurality of support members includes a support part that holds the display panel at the predetermined height, and a roller part located on the support part and configured to receive the display panel.

In an exemplary embodiment of the present inventive concept, the inspection apparatus further includes a plurality of fixing members that fixes the display panel loaded on the plurality of support members.

In an exemplary embodiment of the present inventive concept, the plurality of fixing member are separated from the display panel during the bending inspection process.

In an exemplary embodiment of the present inventive concept, the plurality of fixing members are fixed to the display panel before imaging the pressing surface of the display panel using the plurality of cameras.

In an exemplary embodiment of the present inventive concept, when the crack occurs in the display panel, the sound wave sensor senses an increase in an amplitude of the sound wave.

In an exemplary embodiment of the present inventive concept, the sound wave sensor is positioned adjacent to a central area of the display panel.

In an exemplary embodiment of the present inventive concept, the plurality of cameras includes at least four cameras, wherein each camera of the at least four cameras is positioned at a corresponding corner portion of the display panel.

In an exemplary embodiment of the present inventive concept, the bending-pressing member presses the display panel to generate an inspection curvature in the display panel. The inspection curvature is larger or smaller than a predetermined curvature of the display panel, and the bending-pressing member is configured to move in a vertical direction by about a micrometer.

According to an exemplary embodiment of the present inventive concept, a method of driving an inspection apparatus includes: supporting a display panel at a predetermined height using a plurality of support members; performing a bending inspection process including pressing a pressing surface of the display panel by a bending-pressing member; sensing a sound wave generated from the display panel during the bending inspection process using a sound wave sensor positioned adjacent to the pressing surface; and detecting a crack of the display panel using the sound wave sensed by the sound wave sensor.

In an exemplary embodiment of the present inventive concept, the method further includes: capturing an image of the display panel corresponding to the pressing surface of the display panel before and after the bending inspection process using a plurality of cameras; and detecting the crack of the display panel using the image of the display panel before the bending inspection process and the image of the display panel after the bending inspection process.

In an exemplary embodiment of the present inventive concept, each of the plurality of support members includes a support part that holds the display panel at the predetermined height, and a roller part located on the support part and configured to receive the display panel.

In an exemplary embodiment of the present inventive concept, a plurality of fixing members fixes the display panel before imaging the pressing surface of the display panel using the plurality of cameras.

In an exemplary embodiment of the present inventive concept, the method further includes separating the plurality of fixing members from the display panel during the bending inspection process.

In an exemplary embodiment of the present inventive concept, when the crack occurs in the display panel, the sound wave sensor senses an increase in an amplitude of the sound wave.

In an exemplary embodiment of the present inventive concept, the sound wave sensor is positioned adjacent to a central area of a long side surface of the display panel.

In an exemplary embodiment of the present inventive concept, the plurality of cameras includes at least four cameras, wherein each camera of the at least four cameras is positioned at a corresponding corner portion of the display panel.

In an exemplary embodiment of the present inventive concept, the bending inspection process further includes moving the bending-pressing member in a vertical direction by about a micrometer, wherein the bending-pressing member presses the display panel to generate an inspection curvature in the display panel, wherein the inspection curvature is larger or smaller than a predetermined curvature of the display panel.

In an exemplary embodiment of the present inventive concept, the method further including detecting a maximum curvature before the crack occurs in the bending inspection process.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be explained in detail with reference to the accompanying drawings.

Figure 1:
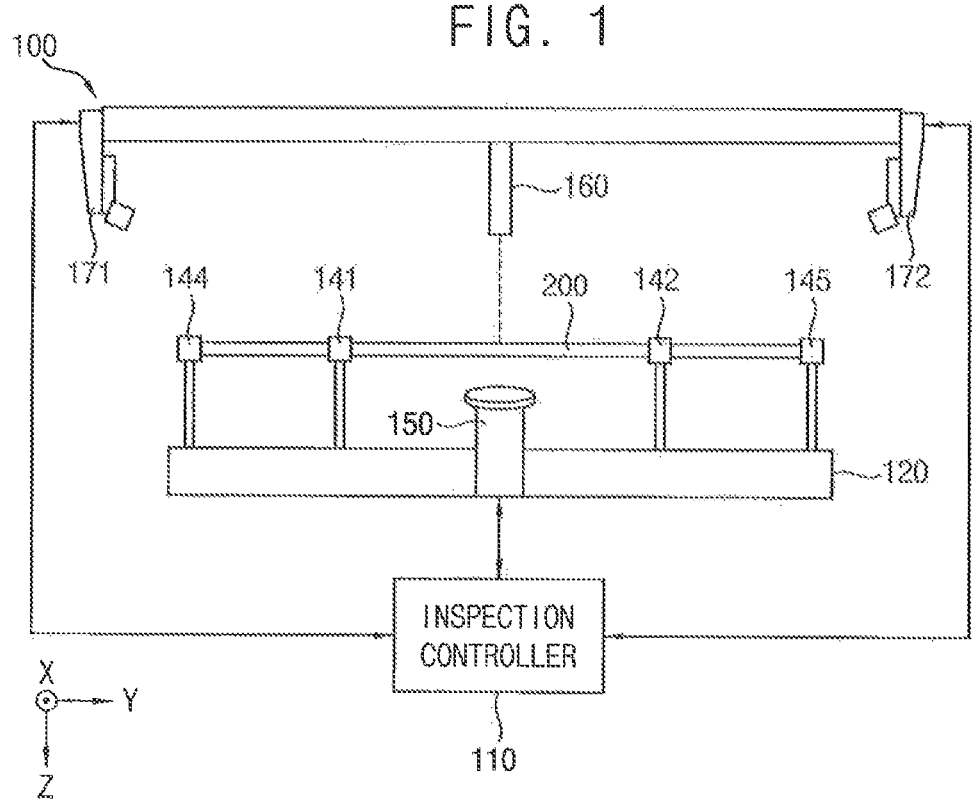
FIG. 1 is a front view illustrating an inspection apparatus according to an exemplary embodiment of the present inventive concept.
Figure 2:
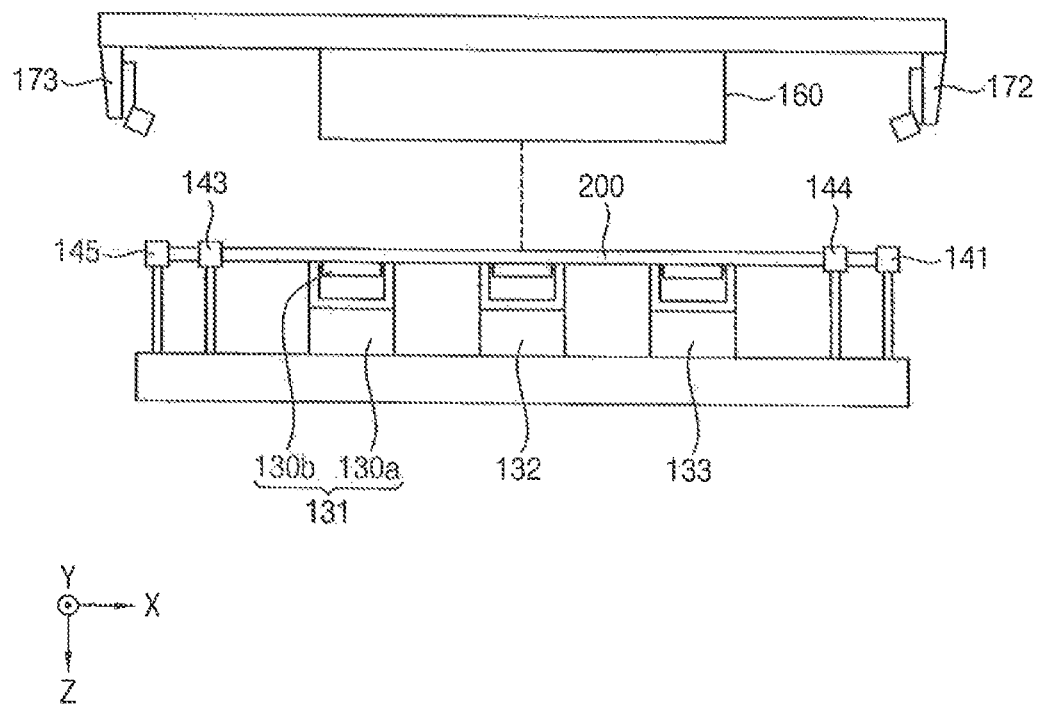
FIG. 2 is a side view illustrating the inspection apparatus in FIG. 1.

FIG. 1 is a front view illustrating an inspection apparatus according to an exemplary embodiment of the present inventive concept. FIG. 2 is a side view illustrating the inspection apparatus in FIG. 1.

Referring to FIGS., 1 and 2, the inspection apparatus 100 bends a display panel 200 in a bending inspection process to apply the display panel 200 to a curved display device. In addition, the inspection apparatus 100 inspects the display panel 200 for a bending defect during the bending inspection process.

For example, the display panel 200 may include a flexible substrate. The display panel 200 may have a bending defect depending on the amount of force applied to the display panel 200 by the inspection apparatus 100. For example, the bending defect may include breakage of the substrate at the bending portion of the display panel 200, peeling of the bonded substrate, etc.

The inspection apparatus 100 may perform a bending inspection process in a bending inspection condition. The bending inspection condition may press a central area of the display panel 200 to form an inspection curvature that may be set to be greater or less than a target curvature of the curved display device. For example, the target curvature may be a predetermined curvature of the display panel 200 during a manufacturing process. In the bending inspection condition, a display panel 200 in which a bending defect does not occur may be classified as a normal panel. However, a display panel 200 in which a bending defect occurs in the bending inspection condition may be classified as an abnormal panel.

The inspection apparatus 100 may detect a maximum curvature condition that does not cause a bending defect according to a type of display panel through a bending inspection process. The maximum curvature condition may be used as basic data for a manufacturing process before and after the bending inspection process. Therefore, efficiency of a manufacturing process may be increased.

In an exemplary embodiment, the inspection apparatus 100 may include an inspection controller 110, a stage 120, a plurality of support members 131, 132 and 133, a plurality of fixing members 141, 142, 143, 144 and 145, sensor 150, a bending-pressing member 160, and a plurality of cameras 171, 172 and 173.

The inspection controller 110 may control an automated inspection operation of the inspection apparatus 100.

A display panel 200 may be located on the stage 120. For example, the display panel 200 may be a display cell separated from a larger substrate. The display panel 200 may be a liquid crystal display cell or an organic light emitting display cell. The display panel 200 may be a display panel before a circuit member such as a driving chip and an optical film such as a polarizing plate, a protective film, etc., are attached thereto. In addition, the display panel 200 may be a display panel to which the optical film and the circuit member are attached.

The plurality of support members 131, 132 and 133 may support the display panel 200, which is located on the stage 120, at a predetermined height from the stage 120. In other words, the plurality of support members 131, 132, and 133 are disposed between the display panel 200 and the stage 120. The plurality of support members 131, 132 and 133 may be located on the stage 120 in correspondence with edge areas of opposite sides of the display panel 200. For example, when the display panel 200 is a rectangular shape including a short side and a long side, first support members 131, 132 and 133 may be arranged to support a first edge area of a first short side of the display panel 200. In addition, second support members may be arranged to support a second edge area of a second short side of the display panel 200 facing the first short side.

Each support member 131, 132 and 133 may include a support part 130a having a predetermined height and disposed on the stage 120, and a roller part 130b on which the display panel 200 is loaded. For example, the support part 130a may be fixed to the stage 120.

A height of the support part 130a may be set according to a height of a corresponding edge of the display panel 200 corresponding to a curved surface of the display panel 200 bent according to the bending test condition. For example, the support part 130a may be a structure including a pillar shape and may be extendable. For example, the support part 130a may include a telescopic structure.

The roller part 130b may be formed of a material resistant to static electricity to reduce scratches caused by movement of the display panel 200 in a diagonal direction rather than in a horizontal direction in the bending test condition.

The plurality of fixing members 141, 142, 143, 144 and 145 may fix the display panel 200 loaded on the plurality of support members 131, 132 and 133 to prevent the display panel 200 from moving. The plurality of fixing members 141, 142, 143, 144 and 145 may be fixed to the stage 120 and may have a height corresponding to the support members 131, 132 and 133. The display panel 200 may be fixed by at least two fixing members (e.g., 143 and 145) arranged at each corner portion of the display panel 200. For example, each of the plurality of fixing members 141, 142, 143, 144 and 145 may be a clamp, latch or the like.

The plurality of fixing members 141, 142, 143 and 144 and 145 may be fixed on the display panel 200 loaded on the plurality of support members 131, 132 and 133 before capturing an image of the pressing surface of the display panel 200 by using a plurality of cameras 171, 172 and 173. For the bending inspection process of the display panel 200, the plurality of fixing members 141, 142, 143, 144 and 145 are separated from the display panel 200 during the bending inspection process, in which the display panel 200 is bent. In addition, after the bending inspection process is completed, the plurality of fixing members 141, 142, 143 and 144 and 145 may be fixed on the display panel 200 and then, an image of the pressing surface of the display panel may be captured.

The sound wave sensor 150 may sense a sound wave generated from the display panel 200 loaded on the plurality of support members 131, 132, and 133 during the bending inspection process. The sound wave sensor 150 may sense an amplitude of the sound wave generated from the display panel 200 and detect a defect in the display panel 200 generated during the bending inspection process based on the amplitude of a sensed sound wave. The sound wave sensor 150 may be located at various positions with respect to the display panel 200. For example, the sound wave sensor 150 may be positioned in a horizontal direction or a vertical direction with respect to a central area of the display panel 200.

The bending-pressing member 160 may move in a z-axis direction perpendicular to a Y-axis direction with respect to the display panel 200 loaded on the plurality of support members 131, 132, 133 in the bending inspection process. The bending-pressing member 160 may press the central area of the display panel 200 to bend the display panel 200 to have a set curved surface. The above bending-pressing member 160 may control movement in micrometer units. Accordingly, the bending of the display panel 200 may be precisely controlled to provide a predetermined curvature.

In an exemplary embodiment of the present inventive concept, the bending pressing member 160 may be a rectangular plate including a material with a high rigidity.

The plurality of cameras 171, 172 and 173 may be arranged above four vertex portions (or e.g., corner portions) of the display panel 200 loaded on the plurality of support members 131, 133 and 133. The plurality of cameras 171, 172, and 173 may include at least four cameras corresponding to the four vertex portions of the display panel 200. The plurality of cameras 171, 172 and 173 captures a panel image corresponding to the pressing surface of the display panel 200 fixed by the plurality of fixing members 141, 142, 143, 144 and 145 before the bending inspection process and after the bending inspection process. The defects generated in the display panel 200 during the bending inspection process may be detected by comparing images of the display panel 200, captured by the plurality of cameras 171, 172, and 173, before the bending inspection process and after the bending inspection process.

Figure 3:
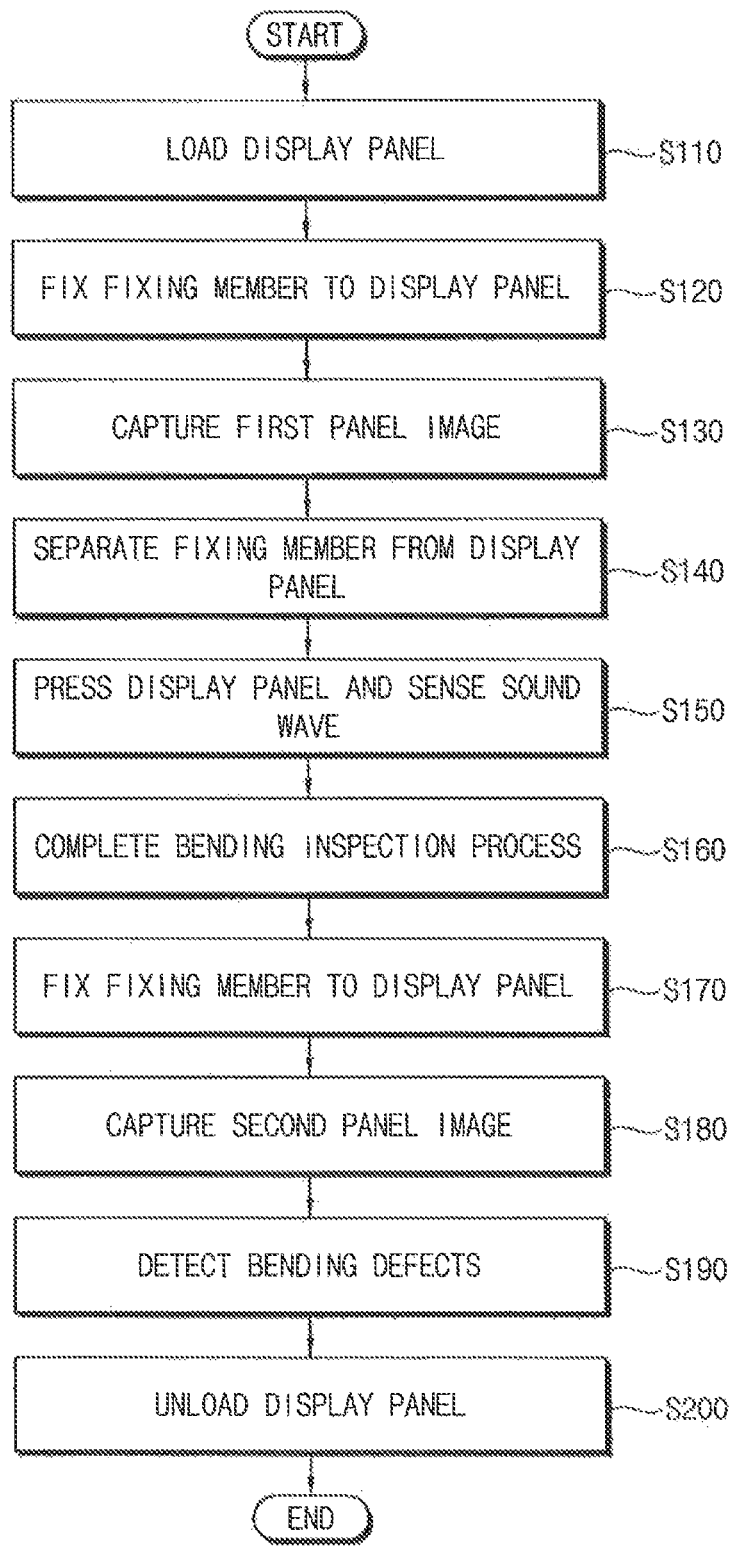
FIG. 3 is a flowchart illustrating a method of driving an inspection apparatus according to an exemplary embodiment of the present inventive concept.

FIG. 3 is a flowchart illustrating a method of driving an inspection apparatus according to an exemplary embodiment of the present inventive concept.

Referring to FIGS. 1 and 3, the inspection controller 110 transfers the display panel 200 to the stage 120. The inspection controller 110 loads the display panel 200 onto the roller parts 130b of the plurality of support members 131, 132 and 133 (Step S110).

The inspection controller 110 operates the plurality of fixing members 141, 142, 143, 144 and 145 such that the plurality of fixing members 141, 142, 143, 144 and 145 are fixed to the four corner portions of the display panel 200 to fix the display panel 200, loaded on the plurality of support members 131, 132 and 133, to the stage 120 (Step S120).

The inspection controller 110 captures a panel image corresponding to a pressing surface of the display panel 200, fixed by the plurality of fixing members 141, 142, 143, 144 and 145 using the plurality of cameras 171, 172, and 173. The inspection controller 110 stores a captured first panel image (Step S130).

Thereafter, the inspection controller 110 separates the plurality of fixing members 141, 142, 143, 144 and 145 from the display panel 200 for the bending inspection process (Step S 140).

The inspection controller 110 moves the bending-pressing member 160 in the Z-axis direction to perform the bending inspection process for bending the display panel 200 to an inspection curvature. At the same time that the bending inspection process is starting, the inspection controller 110 starts operating the sound wave sensor 150 (Step S150).

In the bending inspection process, the bending-pressing member 160 presses the Y-axis central area of the display panel 200 loaded on the roller parts 130b of the plurality of support members 131, 132, and 133. The bending-pressing member 160 presses the central area of the display panel 200, so that the display panel 200 is curved to the inspection curvature to form a curved surface. The sound wave sensor 150 senses a sound wave generated from the display panel 200 while the display panel 200 is bent.

When the bending inspection process is completed, the inspection controller 110 stops the operation of the sound wave sensor 150 and moves the bending-pressing member 160 in a −Z direction opposite to the Z direction. In other words, the bending-pressing member 160 is moved away from the display panel 200. Accordingly, the central area of the display panel 200 is restored from the curved surface to the flat surface. Thus, the bending inspection process of the display panel 200 is completed (Step S160).

After the bending inspection process, the inspection controller 110 fixes the plurality of fixing members 141, 142, 143, 144 and 145 to the four corner portions of the display panel 200 to fix the display panel 200 loaded on the plurality of support members 131, 132 and 133 to the stage 120 (Step S170).

The inspection controller 110 captures another (e.g., a second) panel image corresponding to a pressing surface of the display panel 200 fixed by the plurality of fixing members 141, 142, 143, 144 and 145 using the plurality of cameras 171, 172, and 173. The inspection controller 110 stores a captured second panel image (Step S180).

The inspection controller 110 detects defects generated during the bending inspection process of the display panel 200 by comparing the panel images captured before and after the bending inspection process. For example, the first panel image, captured before the display panel 200 is bent, is compared with the second panel image, captured after the display panel 200 is bent.

In addition, the inspection controller 110 detects defects generated during the bending inspection process by comparing the amplitude of the sensed sound wave with a reference value (Step S190).

The inspection controller 110 may precisely detect the defects of the display panel 200 by performing a logical AND operation or a logical OR operation on the comparison result value of the panel images and the comparison result value of the sound wave.

As described above, when a defect inspection is completed, the inspection controller 110 unloads the display panel 200 from the stage 120 to, for example, perform subsequent manufacturing processes (Step S200).

According to an exemplary embodiment of the present inventive concept, the inspection apparatus may automate the bending defect inspection of the display panel. In addition, the inspection apparatus may detect the defects by comparing the panel images captured before and after the bending inspection process, and may detect the defects by sensing the sound wave generated from the bending of the display panel during the bending inspection process. Therefore, defects of the display panel may be accurately detected through the captured images and the sensed sound wave. In addition, in the bending inspection process, the maximum curvature condition at which no defect occurs may be obtained. The maximum curvature condition may be used for previous processes and subsequent processes, and thus, overall process efficiency may be increased.

Figure 4A:
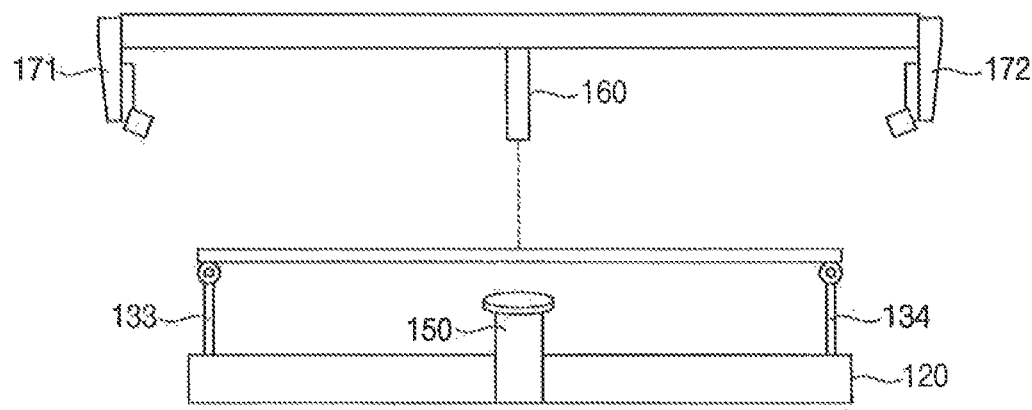
FIGS. 4A and 4B are conceptual diagrams illustrating a method of imaging a display panel before and after a bending inspection process of an inspection apparatus according to an exemplary embodiment of the present invention.
Figure 4A:
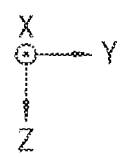
Figure 4B:
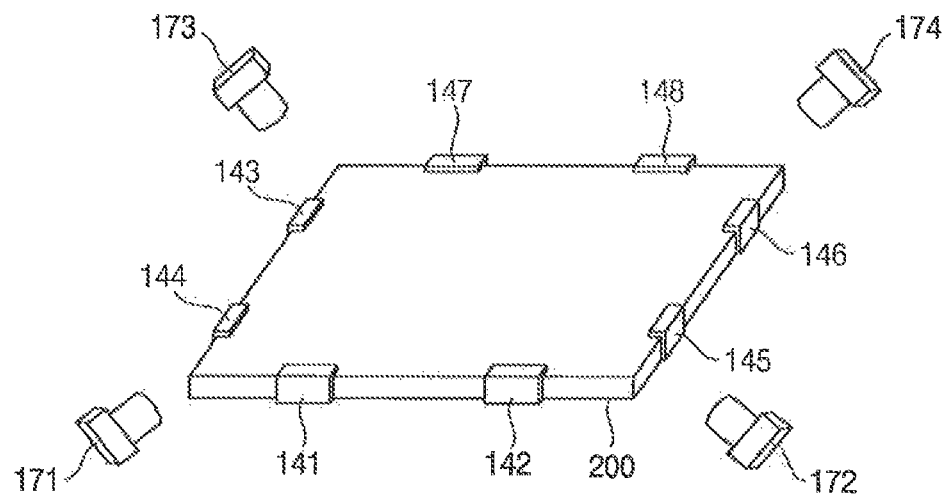
Figure 4B:
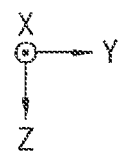
Figure 5A:
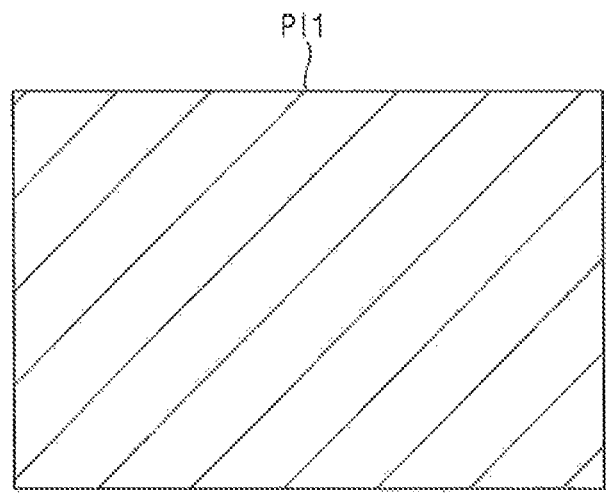
FIGS. 5A and 5B are conceptual diagrams illustrating an inspection method using panel images of an inspection apparatus according to an exemplary embodiment of the present inventive concept.
Figure 5B:
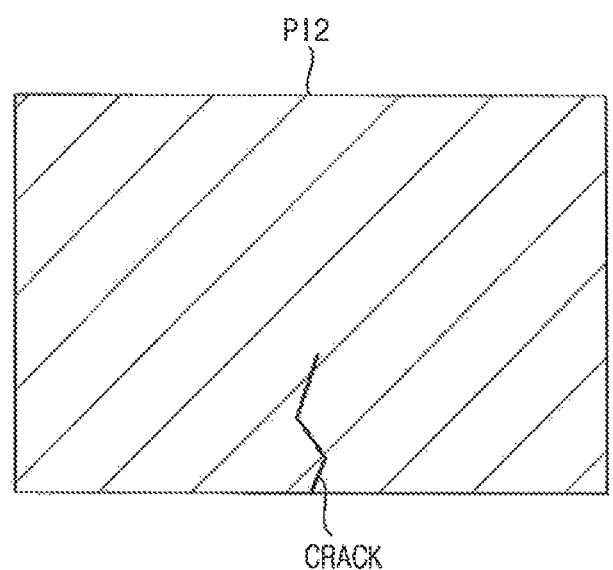

FIGS. 4A and 4B are conceptual diagrams illustrating a method of imaging a display panel before and after a bending inspection process of an inspection apparatus according to an exemplary embodiment of the present inventive concept. FIGS. 5A and 5B are conceptual diagrams illustrating an inspection method using panel images of an inspection apparatus according to an exemplary embodiment of the present inventive concept.

Referring to FIGS. 4A and 4B, the four cameras 171, 172, 173, and 174 are located at positions corresponding to the four vertex portions of the display panel 200, respectively.

The four cameras 171, 172, 173 and 174 may capture images of the pressing surface of the display panel 200 without the bending-pressing member 160 on the pressing surface of the display panel 200 to minimize diffuse reflection. For example, the four cameras 171, 172, 173, and 174 may capture images of the pressing surface of the display panel 200 before and after the bending inspection process.

In addition, a lamp for capturing an image may irradiate a light at an angle of about 30 degrees to about 60 degrees with respect to a back surface of the display panel 200. For example, the lamp may have a bar shape parallel to the long side direction of the display panel 200.

To minimize the defect detection deviation, the four cameras 171, 172, 173, and 174 may be located at an angle of about 45 degrees both horizontally and vertically with the lamp. For example, the cameras 171, 172, 173 and 174 may be located at an angle of about 45 degrees with respect to a surface of the display panel 200.

The plurality of fixing members 141, 142, 143, 144, 145, 146, 147 and 148 is fixed to the four corner portions of the display panel 200 to fix the display panel 200 to the stage 120 to prevent movement before imaging the pressing surface of the display panel 200. For example, the plurality of fixing members 141, 142, 143, 144, 145, 146, 147 and 148 may be fixed to the display panel 200 before images of the pressing surface are captured.

For example, before the bending inspection process, a first panel image is obtained by imaging the pressing surface of the display panel 200 using the four cameras 171, 172, 173 and 174.

In an exemplary embodiment of the present inventive concept, the cameras 171, 172, 173 and 174 may capture images of the pressing surface of the display panel 200, and the images may be combined to generate the first panel image.

Referring to FIG. 5A, the first panel image PI1 is captured before the bending inspection process. The first panel image PI1 may be an image before the bending inspection process, and may be an image of the display panel 200 while flat and with no defects.

After the bending inspection process is completed, the inspection controller captures a second panel image for comparison with the first panel image PI1 captured before the bending inspection process.

The plurality of fixing members 141, 142, 143, 144, 145, 146, 147 and 148 is fixed to the four corner portions of the display panel 200 before capturing the second panel image to implement the same physical condition as the first panel image PI1.

After the bending inspection process, a second panel image is obtained by imaging the pressing surface of the display panel 200 using the four cameras 171, 172, 173 and 174.

In an exemplary embodiment of the present inventive concept, the cameras 171, 172, 173 and 174 may capture images of the pressing surface of the display panel 200, and the images may be combined to generate the second panel image.

Referring to FIG. 5B, after the bending inspection process, the second panel image PI2 is obtained. For example, the second panel image PI2 may include defects generated during the bending inspection process, such as cracks and ruptures.

The inspection controller may detect defects occurring during the bending inspection process by comparing the first panel image PI1 captured before the bending inspection process and the second panel image PI2 captured after the bending inspection process.

Figure 6A:
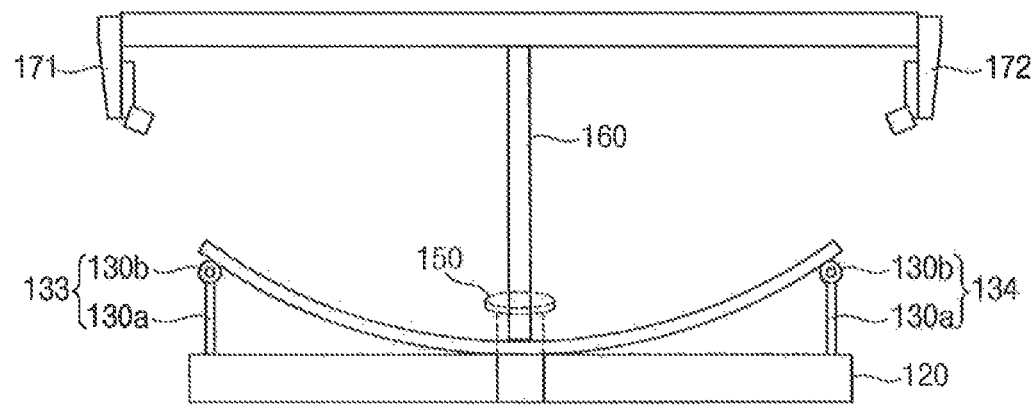
FIGS. 6A and 6B are conceptual diagrams illustrating a method of sensing a sound wave during a bending inspection process of an inspection apparatus according to an exemplary embodiment of the present inventive concept.
Figure 6B:
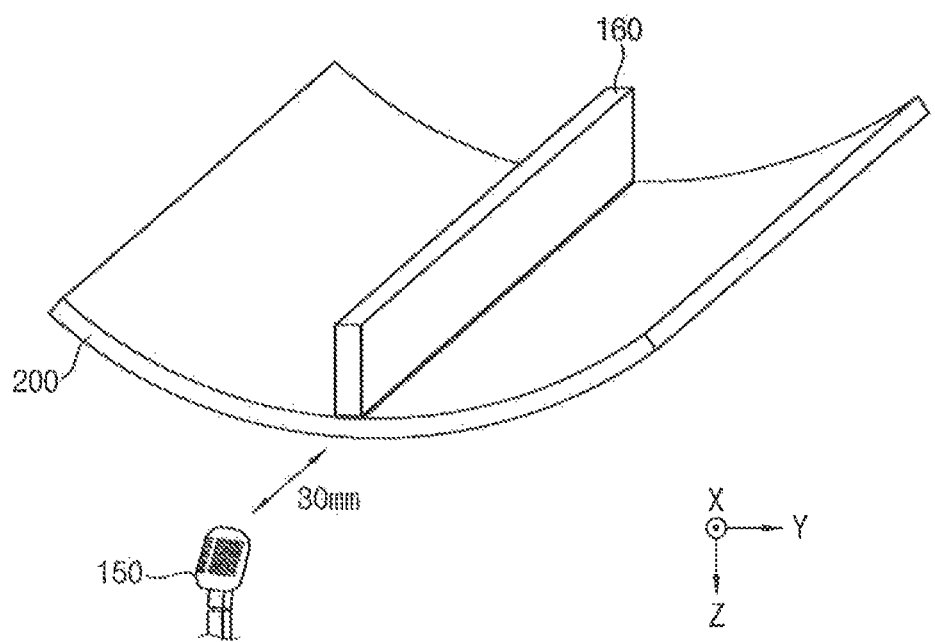
Figure 7:
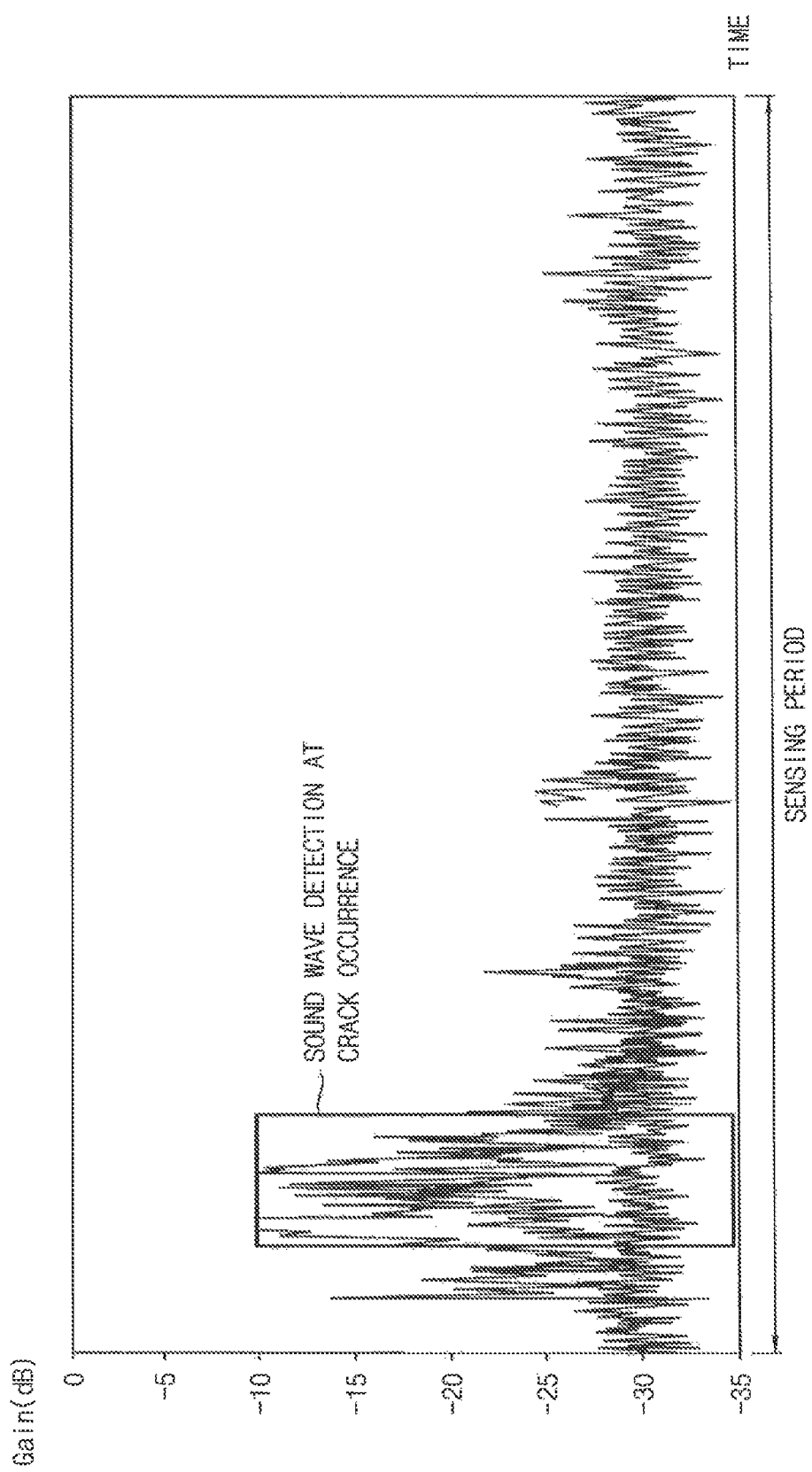
FIG. 7 is a graph illustrating a sound wave sensed during a bending inspection process according to an exemplary embodiment of the present inventive concept.

FIGS. 6A and 6B are conceptual diagrams illustrating a method of sensing a sound wave during a bending inspection process of an inspection apparatus according to an exemplary embodiment of the present inventive concept. FIG. 7 is a graph illustrating a sound wave sensed during a bending inspection process according to an exemplary embodiment of the present inventive concept.

Referring to FIGS. 6A and 6B, the inspection controller performs a bending inspection process for bending the display panel 200 loaded on the plurality of support members 133 and 134 to a predetermined inspection curvature.

The inspection curvature may have a curvature of about twice a target curvature of a curved display device to which the display panel 200 is applied. For example, when the target curvature of the curved display device is about 1800 R (Radius), the inspection curvature may be set to about 900 R. By increasing the inspection curvature of the display panel 200 to be larger than the target curvature, bending defects occurring in subsequent module processes may be reduced.

To perform the bending inspection process, the inspection controller moves the bending-pressing member 160 in a Z-axis direction perpendicular to the pressing surface of the display panel 200, and thus, the bending-pressing member 160 is located so as to touch the pressing surface of the display panel 200.

Then, the inspection controller moves the bending-pressing member 160 in the Z-axis direction to press the pressing surface of the display panel 200 to generate a bend in the display panel 200. At the same time that the bending inspection process is starting, the inspection controller starts operation of the sound wave sensor 150.

The sound wave sensor 150 may be separated from the central area of the long side of the display panel 200 by about 30 mm in the horizontal direction (e.g., the X axis direction). The sound wave sensor 150 senses a sound wave generated from the display panel 200 bending during the bending inspection process. For example, the sound wave sensor 150 may include a micro phone. The sound wave sensor 150 may sense a sound wave generated by cracks or ruptures generated in the display panel 200.

When the display panel 200 is cracked or ruptured, the amplitude of the sound wave sensed by the sound wave sensor 150 may relatively increase. Accordingly, the inspection controller determines that a bending defect occurs in the display panel 200 when the amplitude of the sound wave, sensed by the sound wave sensor 150 during the bending inspection process, exceeds the reference value. When the bending inspection process is completed, the inspection controller may stop the operation of the sound wave sensor 150.

Referring to FIG. 7, during the bending inspection process, the sound wave sensor 150 senses a sound wave generated from the display panel 200. As shown in FIG. 7, when the crack or rupture occurs in the display panel 200 during the bending inspection process, the amplitude of the sound wave suddenly increases. The inspection controller may determine that a defect such as crack or breakage has occurred in the display panel 200 when the amplitude of the sound wave sensed by the sound wave sensor 150 exceeds the response value.

As described above, during the bending inspection process in which the display panel is bent, the sound wave generated from the display panel may be sensed by the sound wave sensor to determine whether the display panel is defective or not.

According to an exemplary embodiment of the present inventive concept, the inspection apparatus may automate the bending defect inspection of the display panel. In addition, the inspection apparatus may detect the defects by comparing the panel images captured before and after the bending inspection process, and may detect the defects by sensing the sound wave generated from the display panel bending during the bending inspection process. Therefore, the defects may be accurately inspected through the captured images and sensed sound wave. In addition, in the bending inspection process, the maximum curvature condition at which no defect occurs may be obtained. The maximum curvature condition may be used for previous processes and subsequent processes, and thus, overall process efficiency may be increased.

The present inventive concept may be applied to a display device and an electronic device having the display device. For example, the present inventive concept may be applied to a computer monitor, a laptop, a digital camera, a cellular phone, a smart phone, a smart pad, a tablet computer, a television, a personal digital assistant (PDA), a portable multimedia player (PMP), an MP3 player, a navigation system, a game console, a video phone, etc.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. An inspection apparatus comprising:
   a plurality of support members that support a display panel at a predetermined height;
   a bending-pressing member that presses a pressing surface of the display panel;
   a sound wave sensor that senses a sound wave generated from the display panel during a bending inspection process, wherein during the bending inspection process, the bending-pressing member presses the pressing surface of the display panel; and
   an inspection controller that detects a crack in the display panel using the sound wave sensed by the sound wave sensor.

2. The inspection apparatus of claim 1, further comprising:
   a plurality of cameras that capture an image of the display panel corresponding to the pressing surface of the display panel before and after the bending inspection process,
   wherein the inspection controller detects the crack of the display panel using the image of the pressing surface before the bending inspection process and the image of the pressing surface after the bending inspection process.

3. The inspection apparatus of claim 1, wherein each of the plurality of support members comprises a support part that holds the display panel at the predetermined height, and a roller part located on the support part and configured to receive the display panel.

4. The inspection apparatus of claim 2, further comprising:
   a plurality of fixing members that fixes the display panel loaded on the plurality of support members.

5. The inspection apparatus of claim 4, wherein the plurality of fixing member are separated from the display panel during the bending inspection process.

6. The inspection apparatus of claim 4, wherein the plurality of fixing members are fixed to the display panel before imaging the pressing surface of the display panel using the plurality of cameras.

7. The inspection apparatus of claim 1, wherein when the crack occurs in the display panel, the sound wave sensor senses an increase in an amplitude of the sound wave.

8. The inspection apparatus of claim 1, wherein the sound wave sensor is positioned adjacent to a central area of the display panel.

9. The inspection apparatus of claim 2, wherein the plurality of cameras comprises at least four cameras, wherein each camera of the at least four cameras is positioned at a corresponding corner portion of the display panel.

10. The inspection apparatus of claim 1, wherein the bending-pressing member presses the display panel to generate an inspection curvature in the display panel, wherein the inspection curvature is larger or smaller than a predetermined curvature of the display panel, and the bending-pressing member is configured to move in a vertical direction by about a micrometer.

11. A method of driving an inspection apparatus comprising:

supporting a display panel at a predetermined height using a plurality of support members;

performing a bending inspection process including pressing a pressing surface of the display panel by a bending-pressing member;

sensing a sound wave generated from the display panel during the bending inspection process using a sound wave sensor positioned adjacent to the pressing surface; and detecting a crack of the display panel using the sound wave sensed by the sound wave sensor.

12. The method of claim 11, further comprising:

capturing an image of the display panel corresponding to the pressing surface of the display panel before and after the bending inspection process using a plurality of cameras; and detecting the crack of the display panel using the image of the display panel before the bending inspection process and the image of the display panel after the bending inspection process.

13. The method of claim 11, wherein each of the plurality of support members comprises a support part that holds the display panel at the predetermined height, and a roller part located on the support part and configured to receive the display panel.

14. The method of claim 12, wherein a plurality of fixing members fixes the display panel before imaging the pressing surface of the display panel using the plurality of cameras.

15. The method of claim 14, further comprising:

separating the plurality of fixing members from the display panel during the bending inspection process.

16. The method of claim 11, wherein when the crack occurs in the display panel, the sound wave sensor senses an increase in an amplitude of the sound wave.

17. The method of claim 11, wherein the sound wave sensor is positioned adjacent to a central area of a long side surface of the display panel.

18. The method of claim 12, wherein the plurality of cameras comprises at least four cameras, wherein each camera of the at least four cameras is positioned at a corresponding corner portion of the display panel.

19. The method of claim 11, wherein the bending inspection process further includes moving the bending-pressing member in a vertical direction by about a micrometer, wherein the bending-pressing member presses the display panel to generate an inspection curvature in the display panel, wherein the inspection curvature is larger or smaller than a predetermined curvature of the display panel.

20. The method of claim 11, further comprising:

detecting a maximum curvature before the crack occurs in the bending inspection process.

* * * * *